(12) United States Patent
Andreev et al.

(10) Patent No.: US 8,527,851 B2
(45) Date of Patent: Sep. 3, 2013

(54) SYSTEM AND METHOD FOR USING THE UNIVERSAL MULTIPOLE FOR THE IMPLEMENTATION OF A CONFIGURABLE BINARY BOSE-CHAUDHURI-HOCQUENGHEM (BCH) ENCODER WITH VARIABLE NUMBER OF ERRORS

(75) Inventors: Alexander E. Andreev, San Jose, CA (US); Elyar E. Gasanov, Moscow (RU); Pavel Aliseychik, Moscow (RU); Ilya Neznanov, Moscow (RU); Pavel Panteleev, Moscow (RU)

(73) Assignee: LSI Corporation, San Jose, CA (US)

( * ) Notice: Subject to any disclaimer, the term of this patent is extended or adjusted under 35 U.S.C. 154(b) by 884 days.

(21) Appl. No.: 12/221,484

(22) Filed: Aug. 4, 2008

(65) Prior Publication Data
US 2010/0031126 A1  Feb. 4, 2010

(51) Int. Cl.
*H03M 13/00* (2006.01)
(52) U.S. Cl.
USPC ........... 714/781; 714/757; 714/784; 714/704; 714/746; 714/756; 714/774; 714/782
(58) Field of Classification Search
None
See application file for complete search history.

(56) References Cited

U.S. PATENT DOCUMENTS

| | | | | |
|---|---|---|---|---|
| 5,271,022 A * | 12/1993 | Berlekamp et al. | ........... | 714/755 |
| 5,444,719 A * | 8/1995 | Cox et al. | ........... | 714/769 |
| 5,473,620 A * | 12/1995 | Zook et al. | ........... | 714/785 |
| 5,487,077 A * | 1/1996 | Hassner et al. | ........... | 714/762 |
| 5,822,337 A * | 10/1998 | Zook et al. | ........... | 714/785 |
| 6,353,909 B1 * | 3/2002 | Amrany et al. | ........... | 714/757 |
| 6,978,415 B1 * | 12/2005 | Weng | ........... | 714/781 |
| 7,516,394 B2 * | 4/2009 | Ashley et al. | ........... | 714/784 |
| 2010/0088557 A1 * | 4/2010 | Weingarten et al. | ........... | 714/704 |
| 2011/0081041 A1 * | 4/2011 | Sharma et al. | ........... | 382/100 |
| 2011/0138256 A1 * | 6/2011 | Betts | ........... | 714/777 |

* cited by examiner

*Primary Examiner* — John Trimmings
(74) *Attorney, Agent, or Firm* — Suiter Swantz pc llo

(57) ABSTRACT

The present invention is a configurable binary BCH encoder having a variable number of errors. The encoder may implement a universal multipole block which may be configured for receiving an error number input, which may include a maximum error number limit for the encoder, and for calculating a plurality of error coefficients based on the error number input. The encoder may be further configured for receiving a plurality of information bits of an information word. The encoder may be further configured for transmitting/outputting a first (ex.—unmodified) subset of the information bits as an encoder output. The encoder may be further configured for calculating a plurality of parity bits based on a second subset of the information bits and the error coefficients. The encoder may be further configured for transmitting/outputting the calculated parity bits as part of the encoder output.

12 Claims, 3 Drawing Sheets

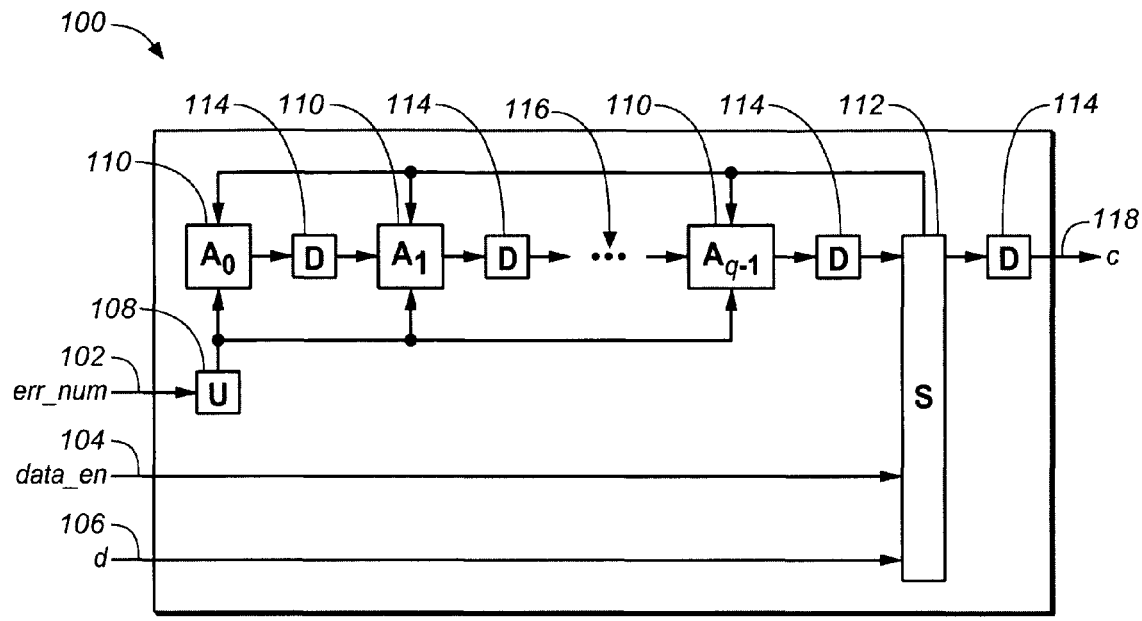
FIG. 1
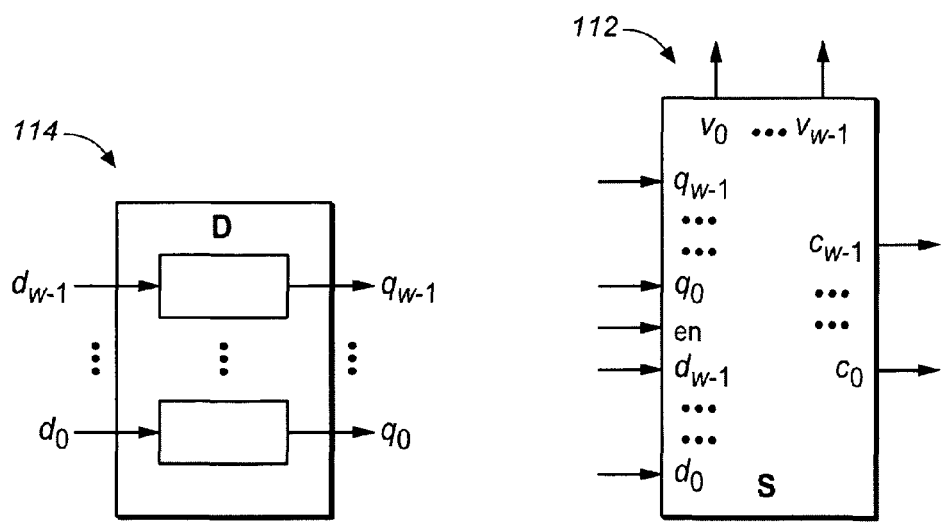
FIG. 2          FIG. 3

SYSTEM AND METHOD FOR USING THE UNIVERSAL MULTIPOLE FOR THE IMPLEMENTATION OF A CONFIGURABLE BINARY BOSE-CHAUDHURI-HOCQUENGHEM (BCH) ENCODER WITH VARIABLE NUMBER OF ERRORS

FIELD OF THE INVENTION

The present invention relates to the field of encoder/decoder design and particularly to a system and method for using the universal multipole for the implementation of a configurable binary Bose-Chaudhuri-Hocquenghem (BCH) encoder with variable number of errors.

BACKGROUND OF THE INVENTION

Currently available encoders/decoders may not provide a desired level of performance.

Therefore, it may be desirable to provide a solution which addresses the above-referenced problems associated with current encoders/decoders.

SUMMARY OF THE INVENTION

Accordingly, an embodiment of the present invention is directed to an encoder, including: a plurality of register blocks; a plurality of adder logic blocks, said plurality of adder logic blocks being communicatively coupled with the plurality of register blocks; a switching logic block, said switching logic block being communicatively coupled with the plurality of adder logic blocks, said switching logic block being configured for receiving a plurality of information bits of an information word received by the encoder, said switching logic further configured for generating a first output based on a first set of information bits included in the plurality of information bits, said switching logic block further configured for generating a second output based on a second set of information bits included in the plurality of information bits, said switching logic block further configured for providing the second output to the plurality of adder logic blocks; and a universal multipole block, said universal multipole block being communicatively coupled with the plurality of adder logic blocks, said universal multipole block being configured for receiving an error number input, said universal multipole block further configured for calculating a plurality of error coefficients based on the error number input, said universal multipole block further configured for outputting the plurality of coefficients to the adder logic blocks, wherein the adder logic blocks are configured for calculating a plurality of parity bits based on the error coefficients received from the universal multipole block and further based on the second output received from the switching logic block, said adder logic blocks further configured for providing the parity bits to the plurality of register blocks, the encoder configured for outputting the parity bits and the first output of the switching logic block.

A further embodiment of the present invention is directed to a method for providing an encoder having a variable number of errors, including: receiving an error number input; calculating a plurality of error coefficients based on the error number input; providing the error coefficients to a plurality of adder logic blocks; and receiving a data receive signal via a data enable input.

An additional embodiment of the present invention is directed to a computer-readable medium having computer-executable instructions for performing a method for providing an encoder having a variable number of errors, said method including: receiving an error number input; calculating a plurality of error coefficients based on the error number input; providing the error coefficients to a plurality of adder logic blocks; receiving a data receive signal via a data enable input; and receiving an information word via a data input.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a block diagram schematic illustrating a binary BCH encoder with a universal multipole in accordance with an exemplary embodiment of the present invention;

FIG. 2 is a block diagram schematic illustrating a register block (ex.—D block) which may be implemented as part of a linear shift register of the binary BCH encoder illustrated in FIG. 1 in accordance with an exemplary embodiment of the present invention;

FIG. 3 is a block diagram schematic illustrating a switch logic block which may be implemented as part of the binary BCH encoder illustrated in FIG. 1 in accordance with an exemplary embodiment of the present invention;

DETAILED DESCRIPTION OF THE INVENTION

Figure 4A:
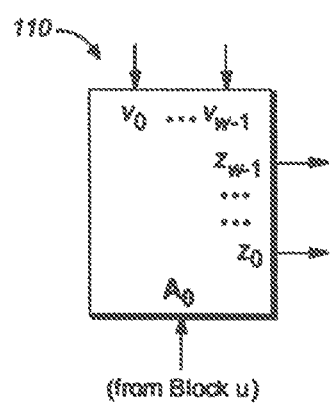
FIGS. 4A and 4B are block diagram schematics illustrating adder logic blocks (ex.—block $A_0$ and block $A_j$ respectively) which may be implemented as part of the binary BCH encoder illustrated in FIG. 1 in accordance with an exemplary embodiment of the present invention.

Bose-Chaudhuri-Hocquenghem (BCH) codes compose a large class of multiple error-correcting codes. Binary BCH codes were discovered in 1959 by Hocquenghem and independently in 1960 by Bose and Ray-Chaudhuri. Later, Gorenstein and Zierler generalized BCH codes to all finite fields. At about that same time, Reed and Solomon published their paper on the special case of BCH codes which now bear their names. In practice, binary BCH codes and binary Reed-Solomon codes are the most commonly used variants of BCH codes.

The binary BCH codes and binary Reed-Solomon codes have applications in a variety of communication systems, such as: space communication links, digital subscriber loops, wireless systems, networking communications systems, and magnetic and data storage systems. Continual demand for ever higher data rates and storage capacity makes it necessary to devise very high-speed and space-efficient Very Large Scale Integration (VLSI) implementations of BCH decoders. The first decoding algorithm for binary BCH codes was proposed by Peterson in 1960. Since then, Peterson's algorithm has been refined by Gorenstein, Zierler, Berlekamp, Massey, Chien, Forney and many others. Let GF(q) be a finite field of q elements, $q=2^s$, called base field, and let $\alpha$ be a primitive element of extension field $GF(q^m)$, where $n|q^m-1$. Define t error detecting BCH code of length n over $GF(q)$ as the set of all sequences $(c_0, c_1, \ldots, c_{n-1})$, $c_i \in GF(q)$ such that polynomial $$c(x) = c_0 + c_1 x + \ldots + c_{n-1} x^{n-1} \in GF(q^m)[x]$$

has roots in points: $\alpha^1, \alpha^2, \ldots, \alpha^{2t}$. BCH code with m=1 is called Reed Solomon code, and with s=1 binary BCH code.

Reference will now be made in detail to the presently preferred embodiments of the invention, examples of which are illustrated in the accompanying drawings.

Referring generally to FIG. 1, an encoder/decoder 100 in accordance with an exemplary embodiment of the present invention is shown. For example, the encoder 100 may be a binary BCH encoder. Further, the encoder 100 may be a configurable binary BCH encoder with a variable number of errors. As shown in the illustrated embodiment, the encoder 100 may be configured for receiving an error number input (ex.—err_num) 102. Further, the encoder 100 may be configured for receiving a data enable input (ex.—data_en) 104. Still further, the encoder 100 may be configured for receiving a data input (ex.—d) 106.

In current embodiments of the present invention, the encoder 100 may include a universal multipole block (ex.—block U) 108. The universal multipole block 108 may be configured for receiving the error number input 102. Further, the universal multipole block 108 may be configured for calculating one or more error coefficients based on the error number input 102. Still further, the universal multipole block 108 may be configured for providing the error coefficients to one or more adder logic blocks/adders (ex.—blocks $A_0, A_1 \ldots A_{q-1}$) 110, said adder logic blocks 110 being communicatively coupled to the universal multipole block 108. For example, the error coefficients may be transmitted to the adder logic blocks 110 via a parallel transmission (as shown in FIG. 1). In exemplary embodiments, the error number input may be/may include a selected/predefined/predetermined maximum number of errors/maximum error limit/maximum error number/maximum error number limit, the encoder 100 may be configured to work with/withstand and remain operable when encoding information. Said maximum number of errors may be variable and may further be implemented in hardware.

Universal multipole for variables $x_1, x_2, \ldots, x_n$ is a scheme with n inputs and $2^{2^n}$ outputs which implement all Boolean functions on variables $x_1, x_2, \ldots, x_n$. It is well known that universal multipole can be constructed using $2^{2^n}$ elements from the set $\{\&, \vee, \neg\}$. In the present invention, the universal multipole (ex.—universal multipole block 108) may be implemented instead of implementing multiplexers. In practice, e may be the number of error variants, i.e the number of errors to correct may be from the set $\{t_0, t_1, \ldots, t_{e-1}\}$. Further, each multiplexer mux(err_num, $f_{ijk}^0, \ldots, f_{ijk}^{e-1}$) may be a Boolean function on $\log_2 e$ variables, because $f_{ijk}^0, \ldots, f_{ijk}^{e-1}$ are constants. Often, e may be small, and $2^e$ may be essentially less than $C w^2 q$, where C may be the area of a multiplexer. In exemplary embodiments, one universal multipole/universal multipole block 108 may be implemented instead of implementing all multiplexers, which may greatly reduce the area of the encoder 100. In the present invention, the universal multipole block 108 may implement the universal multipole on $\log^2 e$ variables. Each adder logic block $A_i$, i=0, 1, ..., q–1, may use $w^2$ needful functions from the output of the universal multipole block/block U 108.

As mentioned above, the encoder 100 of the present invention may be configured for receiving a data input 106. Further, the encoder 100 may be configured for receiving an information word (ex.—a word to be encoded) via the received data input 106. For instance, the information word may include a plurality of information bits, which may be received by the encoder in a singular manner (ex.—one bit at a time).

As mentioned above, the encoder 100 of the present invention may be configured for receiving a data enable input 104. Further, the encoder 100 may be configured for receiving a data receive signal via the received data enable input 104. The data receive signal may signal the encoder 100 that said encoder is ready to begin/may begin/is cleared or allowed to begin/should begin/is about to begin receiving the data input 106 (ex.—the encoder may begin receiving information bits of the information word/bits of the information word may begin to be fed into the encoder). Further, the data receive signal may cause the encoder 100 to begin receiving the data input 106 (ex.—the information word). For example, the data receive signal of the received data enable input 104 may be/include a value equal to 1.

In further embodiments, as the plurality of information bits of the information word are being fed into the encoder 100, said plurality of information bits are provided to a switch logic block/switching logic block 112 (ex.—S block) of the encoder 100. The switch logic block 112 is configured for generating a first output based on a first set of information bits included in the plurality of information bits. Further, the switch logic block 112 may be configured for directing the first output (ex.—the unmodified first set of information bits) to a register block (ex.—a D block/block of registers) included in a plurality of register blocks 114, said register block 114 being communicatively coupled with the switch logic block 112. Said register blocks/D blocks 114 may be implemented as part of a linear shift register 116 of the encoder 100. Further said first output (ex.—the unmodified first set of information bits) may be transmitted from encoder 100 via/as part of encoder output 118 (shown as c in FIG. 1).

In current embodiments of the present invention, the switch logic block 112 may be configured for generating a second output based on a second set of information bits included in the plurality of information bits/information symbols. Further, the switch logic block 112 may be configured for directing the second output to the plurality of adder logic blocks 110, said adder logic blocks 110 being communicatively coupled with the switch logic block 112. For example, the second output may be transmitted via a parallel transmission from the switch logic block 112 to the adder logic blocks 110 (as shown in FIG. 1). Inputs and outputs of the switch logic block/S block 112 are shown in FIG. 3. The functioning of the switch logic block/S block may be determined by the following formulas:

$$x_i = q_{w-1-i}, i=0, 1, \ldots, w=1;$$

$$v_i = ((x_i + d_i) \bmod 2) \& en, i=0, 1, \ldots, w-1;$$

$$c_i = (en \& d_i) \vee (\neg en \& x_i), i=0, 1, \ldots, w-1.$$

In exemplary embodiments, the adders/adder logic blocks (ex.—the A blocks) 110 are communicatively coupled with the switch logic block 112 and are configured for receiving the second output based from the switch logic block 112. Further, the adders/adder logic blocks/A blocks 110 are communicatively coupled with the universal multipole block/U block 108 and are configured for receiving the error coefficients from the universal multipole block 108. Further, the adder logic blocks 110 are configured for calculating a plurality of parity bits/parity symbols based on the received error coefficients and the received second output. For instance, the number of parity bits may be precisely defined by the maximum error limit specified in the error number input and/or the error coefficients. Once the adder logic blocks 110 have calculated the parity bits, said parity bits may be provided to the register blocks/D blocks 114 (as shown in FIG. 2) of the linear shift register 116.

Figure 4B:
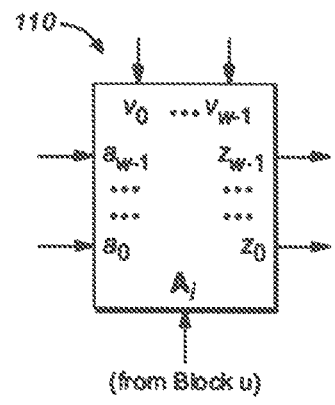

Inputs and outputs of the adder logic blocks/A blocks 110 (ex.—blocks $A_0$ and $A_i$, i=1, 2, ..., p−1) are shown in FIGS. 4A and 4B respectively. When the bus width w=1, blocks $A_0$ and $A_i$ are very simple. The functioning of the block $A_0$ may be determined by the formula $z_0=v_0$. For any i=1, 2, ..., q−1, the functioning of the block $A_i$ is described by the formula $z_0=((v_0 \& g_i)+\alpha_0) \mod 2$, where $g(x)=g_0+g_1x+\ldots+g_px^p$ is the generator polynomial, i.e. $g_i$ is some constant for any i. It is easy to see that if $g_i=0$ then $z_0=\alpha_0$, and if $g_i=1$ then $z_0=(v_0+\alpha_0) \mod 2$. Consider the case when w>1. An auxiliary array $h_i$, i=2−2w, 3−2w, ..., 0, 1, ..., p, may be defined such that $h_i=0$ if i<0, and $h_i=g_i$ for i=0, 1, ..., p; and an auxiliary matrix $(u_{ij})$, i=0, 1, ..., w−1, j=0, 1, ..., w−1, may be constructed where $u_{ii}=1$ for i=0, 1, ..., w−1; $u_{ij}=0$ if $0 \leq j < i < w$;

$$u_{ij} = \left(\sum_{k=0}^{i-1} u_{kj} h_{p-i+k}\right) \mod 2 \text{ if } 0 \leq i < j < w.$$

Denote m=w if p|w, otherwise m=p mod w. An auxiliary matrix, $(f_{ijk})$, i=0, 1, ..., q−1, j=0, 1, ..., w−1, k=0, 1, ..., w−1, may be constructed where $$f_{ijk} = \sum_{l=0}^{w-1} u_{lk} h_{m+(i-2)w+j+l+1}.$$

The functioning of the block $A_0$ may be described by the formulas $$z_j = \left(\sum_{k=0}^{w-1} v_k \& f_{0jk}\right) \mod 2, \quad j = 0, 1, \ldots, w-1.$$

For any i=1, 2, ..., q−1, the functioning of the block $A_i$ may be described by the formulas $$z_j = \left(a_j + \sum_{k=0}^{w-1} v_k \& f_{ijk}\right) \mod 2, \quad j = 0, 1, \ldots, w-1.$$

Note that $f_{ijk}$ are constants, therefore blocks $A_i$, i=0, 1, ..., q−1, may be adders.

As mentioned above, the encoder 100 of the present invention may be a binary BCH encoder. During encoding of binary BCH codes, a generator polynomial $g(x) \in GF(2)$ may be calculated:

$$g(x) = LCM\{M_1(x), M_2(x), \ldots, M_{2t}(x)\},$$

where LCM may be the least common multiplier and $M_i(x)$ may be the minimal polynomial for $\alpha^i$. Let p=deg g(x) be the degree of the generator polynomial and k=n−p be the number of data symbols. Let $(d_0, d_1, \ldots, d_{k-1})$ denote k data symbols that are to be transmitted over a communication channel and $d(x)=d_0+d_1x+\ldots d_{k-1}x^{k-1} \in GF(2)[x]$. The systematic encoding of vector $(d_0, d_1, \ldots, d_{k-1})$ into a codeword $(c_0, c_1, \ldots, c_{n-1})$ may be as follows:

$$c(x) = x^{n-p}d(x) + t(x),$$

where $t(x) = x^{n-p}d(x) \mod g(x)$, $c(x) = c_0+c_1x+\ldots+c_{n-1}x^{n-1}$. Let w be the bus width of the encoder. Write n|w if n divides by w. Denote r=w if n|w, otherwise r=n mod w. For simplicity, we may suppose that k|w. When input data is transmitted to the encoder 100, input data_en 104 may be high. Further, delay of the encoder 100 may be equal to 1. Let ]n[ be the least integer less or equal to n. Denote q=]p/w[. In further embodiments, the encoder 100 may be implemented by a linear feedback shift register (LFSR).

Further, as mentioned above, the encoder 100 may be a configurable binary BCH encoder with a variable number of errors. The functionality of the encoder 100, having a variable number of errors for binary BCH codes may be described as follows:

Let $\{t_0, t_1, \ldots, t_{e-1}\}$ be a set of integers such that $t_0 > t_1 > \ldots > t_{e-1}$. Encoder 100, with variable number of errors or encoder for set of error numbers $\{t_0, t_1, \ldots, t_{e-1}\}$ may have an additional input, called err_num 102. This input may be $\log_2 e$ bits wide. If err_num=s $\in \{0, 1, \ldots, e-1\}$ then the encoder 100 may generate codes correcting $t_s$ errors. Each adder logic block, $A_i$, i=0, 1, ..., q−1, may have an additional input err_num (for receiving data from the universal multipole block 108, as shown in FIGS. 4A and 4B).

Let $g^s(x)=g_0+g_1x+\ldots+g_{p^s}x^{p^s}$, s $\in \{0, 1, \ldots, e-1\}$, be the generator polynomial for $t_s$ errors. Define an auxiliary matrix $(h_i^s)$, i=2−2w, 3−2w, ..., 0, 1, ..., $p^0$, s=0, 1, ..., e−1, such that $h_i^s=0$ if $i<p^0-p^s$, and $h_i^s=g_{i-(p^0-p^s)}$ for $i=p^0-p^s$, $p^0-p^s+1$, ..., $p^0$. Construct an auxiliary matrix $(u_{ij}^s)$, i=0, 1, ..., w−1, j=0, 1, ..., w−1, s=0, 1, ..., e−1, where $u_{ii}^s=1$ for i=0, 1, ..., w−1; $u_{ij}^s=0$ if $0 \leq j < i < w$;

$$u_{ij}^s = \left(\sum_{k=0}^{i-1} u_{kj}^s h_{p^0-i+k}^s\right) \mod 2 \text{ if } 0 \leq i < j < w.$$

Construct an auxiliary matrix $(f_{ijk}^s)$, i=0, 1, ..., q−1, j=0, 1, ..., w−1, k=0, 1, ..., w−1, where $$f_{ijk}^s = \sum_{l=0}^{w-1} u_{lk}^s h_{m+(i-2)w+j+l+1}^s.$$

The functioning of the block $A_0$ may be described by the formulas:

$$z_j = \left(\sum_{k=0}^{w-1} v_k \& mux(err\_num, f_{0jk}^0, \ldots, f_{0jk}^{e-1})\right) \mod 2, \quad j = 0, 1, \ldots, w-1.$$

Here $mux(l, x_0, \ldots, x_{e-1})=x_l$ may be a multiplexer. For any i=1, 2, ..., q−1, the functioning of the block $A_i$ may be described by the formulas:

$$z_j = \left(a_j + \sum_{k=0}^{w-1} v_k \& mux(err\_num, f_{ijk}^0, \ldots, f_{ijk}^{e-1})\right) \mod 2,$$

$$j = 0, 1, \ldots, w-1.$$

If we compare the ordinary encoder and the encoder with variable number of errors then we can see that the encoder with variable number of errors has $w^2q$ additional multiplexers.

As mentioned above, once the adder logic blocks 110 have calculated the parity bits, said parity bits may be provided to the register blocks/D blocks 114 (as shown in FIG. 2) of the linear shift register 116 of the encoder 100. Once each information bit of the information word has been fed into the encoder 100, and once each parity bit has been calculated by the adder logic blocks 110 and provided to the register blocks 114 of the linear shift register 116, the encoder 100 may be configured for receiving another signal (ex.—a data shift signal) via the data enable (data_en) input 104. The data shift signal may indicate to the encoder 100 that no further calculation of parity bits associated with the received information word should occur/no further calculation of parity bits associated with the received information word needs to occur, since calculation of all said parity bits associated with/for the received information is complete. The data shift signal may further indicate to the encoder 100 that since all said parity bits have been calculated and are located in the register blocks 114 of the linear shift register 116, that said parity bits are to begin being shifted out of the encoder 100 and transmitted as an encoder output 118 (shown as c, in FIG. 1), such as via an encoder output port. The data shift signal, once received by the encoder 100, may cause the encoder to begin shifting said parity bits out of the encoder 100. Shifting of parity bits out of the encoder 100 may occur one bit at a time along the linear shift register 116 and out of the encoder 100 via the pathway depicted in FIG. 1. Further, the data shift signal of the received data enable input 104 may be/include a value equal to 0.

In further embodiments, the data enable input 104 may provide a data receive signal, which may be/may include/may specify a value, such as 1. The data receive signal may cause the encoder 100 to begin receiving the information word. Further, the data receive signal may remain in effect/the data enable input may continue to include/specify a value of 1 until: every information bit of the information word has been received by the encoder 100; and every parity bit for the information word has been calculated and provided to the linear shift register 116 of the encoder. Once these conditions are met, the data enable input 104 may provide a data shift signal, which may be/may include/may specify a value, such as 0. The data shift signal may cause the encoder 100 to begin shifting the parity bits along the linear shift register 116 (as shown in FIG. 1) and may further cause the encoder 100 to output said parity bits from the encoder as the encoder output 118. The data shift signal may remain in effect/the data enable input may continue to include/specify/be set at a value of 0 until all of the parity bits for the given information word have been output from the encoder 100 via/as part of the encoder output 118. When this condition has been met, and a subsequent information word is ready to be received, the data enable input 104 may again provide a data receive signal which may cause the encoder 100 to begin receiving the subsequent information word. In exemplary embodiments, because the number of parity bits for a given information word is precisely defined by the maximum error limit specified by the error number input 102, the data shift signal may be set to remain in effect for at least as many clocks as there are parity symbols for, associated with, or calculated based upon the given information word. Further, as mentioned above, said first output (ex.—the unmodified first set of information bits) may be transmitted from encoder 100 via/as part of encoder output 118 (shown as c in FIG. 1). Still further, said first output may be transmitted from the encoder 100 via/as part of encoder output 118 (ex.—along with the parity symbols) when said data shift signal is in effect.

Figure 5:
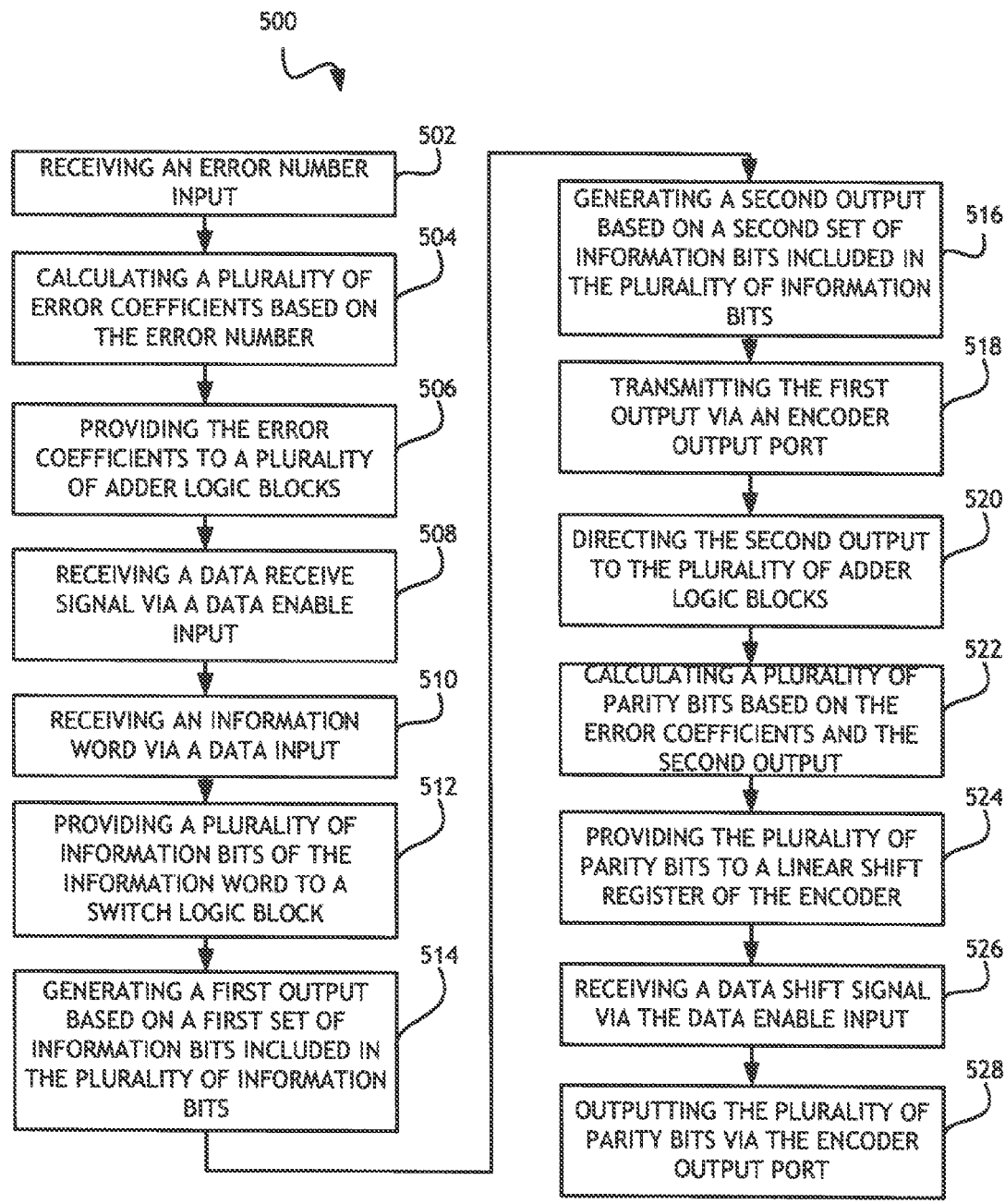
FIG. 5 is a flow diagram illustrating a method for providing an encoder having a variable number of errors in accordance with an exemplary embodiment of the present invention.

FIG. 5 is a flow diagram illustrating an exemplary method providing an encoder having a variable number of errors. The method 500 may be carried out by the encoder 100 of the present invention. The method 500 may include receiving an error number input 502. The method 500 may further include calculating a plurality of error coefficients based on the error number input 504. The method 500 may further include providing the error coefficients to a plurality of adder logic blocks 506. The method 500 may further include receiving a data receive signal via a data enable input 508. The method 500 may further include receiving an information word via a data input 510. The method 500 may further include providing a plurality of information bits of the information word to a switch logic block 512. The method 500 may further include generating a first output based on a first set of information bits included in the plurality of information bits 514. The method 500 may further include generating a second output based on a second set of information bits included in the plurality of information bits 516. The method 500 may further include transmitting the first output via an encoder output port 518. The method 500 may further include directing the second output to the plurality of adder logic blocks 520. The method 500 may further include calculating a plurality of parity bits based on the error coefficients and the second output 522. The method 500 may further include providing the plurality of parity bits to a linear shift register of the encoder 524. The method 500 may further include, when each parity bit included in the plurality of parity bits is stored in the linear shift register, receiving a data shift signal via the data enable input 526. The method 500 may further include shifting the plurality of parity bits to the encoder output port and outputting the plurality of parity bits via the encoder output port 528.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An encoder, comprising:
   a plurality of register blocks;
   a plurality of adder logic blocks, said plurality of adder logic blocks being communicatively coupled with the plurality of register blocks;
   a switching logic block, said switching logic block being communicatively coupled with the plurality of adder logic blocks, said switching logic block being configured for receiving a plurality of information bits of an information word received by the encoder, said switching logic further configured for generating a first output based on a first set of information bits included in the plurality of information bits, said switching logic block further configured for generating a second output based on a second set of information bits included in the plurality of information bits, said switching logic block further configured for providing the second output to the plurality of adder logic blocks; and
   a universal multipole block having n inputs and $2^{2^n}$ outputs, said universal multipole block being communicatively coupled with the plurality of adder logic blocks, said universal multipole block being configured for receiving an error number input, said universal multipole block further configured for calculating a plurality of error coefficients based on the error number input, said universal multipole block further configured for outputting the plurality of coefficients to the adder logic blocks, said universal mulitpole configured to implement Boolean functions on said n inputs,
   wherein the adder logic blocks are configured for calculating a plurality of parity bits based on the error coefficients received from the universal multipole block and further based on the second output received from the switching logic block, said adder logic blocks further configured for providing the parity bits to the plurality of register blocks, the encoder configured for outputting the parity bits and the first output of the switching logic block, the encoder further configured to encode data according to binary Bose-Chaudhuri-Hocquenghem codes.

2. The encoder of claim 1, wherein the maximum error number limit is provided to the encoder via the error number input.

3. A communication system comprising:
   an encoder, comprising:
      a plurality of register blocks;
      a plurality of adder logic blocks, said plurality of adder logic blocks being communicatively coupled with the plurality of register blocks;
      a switching logic block, said switching logic block being communicatively coupled with the plurality of adder logic blocks, said switching logic block being configured for receiving a plurality of information bits of an information word received by the encoder, said switching logic block further configured for generating a first output based on a first set of information bits included in the plurality of information bits, said switching logic block further configured for generating a second output based on a second set of information bits included in the plurality of information bits, said switching logic block further configured for providing the second output to the plurality of adder logic blocks; and
      a universal multipole block having n inputs and $2^{2^n}$ outputs, said universal multipole block being communicatively coupled with the plurality of adder logic blocks, said universal multipole block being configured for receiving an error number input, said universal multipole block further configured for calculating a plurality of error coefficients based on the error number input, said universal multipole block further configured for outputting the plurality of coefficients to the adder logic blocks, said universal mulitpole configured to implement Boolean functions on said n inputs,
      wherein the adder logic blocks are configured for calculating a plurality of parity bits based on the error coefficients received from the universal multipole block and further based on the second output received from the switching logic block, said adder logic blocks further configured for providing the parity bits to the plurality of register blocks, the encoder configured for outputting the parity bits and the first output of the switching logic block; and
   a decoder, comprising:
      a plurality of register blocks;
      a plurality of adder logic blocks, said plurality of adder logic blocks being communicatively coupled with the plurality of register blocks;
      a universal multipole block having $2^{2^n}$ inputs and n outputs, said universal multipole block being communicatively coupled with the plurality of adder logic blocks, said universal multipole block being configured for receiving a plurality of encoded information bits, said universal multipole block further configured for calculating a plurality of error coefficients based on the encoded information bits, said universal multipole block further configured for outputting the plurality of error coefficients to the adder logic blocks, said universal mulitpole configured to implement Boolean functions on said n inputs; and
      a switching logic block, said switching logic block being communicatively coupled with the plurality of adder logic blocks, said switching logic block being configured for receiving a plurality of encoded information bits of an encoded information word received by the decoder, said switching logic block further configured for generating a first output based on a first set of encoded information bits included in the plurality of encoded information bits, said switching logic block further configured for generating a second output based on a second set of encoded information bits included in the plurality of encoded information bits, said switching logic block further configured for providing the second output to the plurality of adder logic blocks,
      wherein the adder logic blocks are configured for decoding an encoded information word having a plurality of parity bits based on the error coefficients received from the universal multipole block and further based on the second output received from the switching logic block, said adder logic blocks further configured for providing the decoded information word to the plurality of register blocks, the decoder configured for outputting the decoded information word.

4. The system of claim 3, wherein the encoder and decoder are configured to encode and decode data according to binary Bose-Chaudhuri-Hocquenghem codes.

5. A decoder, comprising:
a plurality of register blocks;
a plurality of adder logic blocks, said plurality of adder logic blocks being communicatively coupled with the plurality of register blocks;
a universal multipole block having $2^{2^n}$ inputs and n outputs, said universal multipole block being communicatively coupled with the plurality of adder logic blocks, said universal mulitpole configured to implement Boolean functions on said n inputs; and
a switching logic block, said switching logic block being communicatively coupled with the plurality of adder logic blocks, said switching logic block being configured for receiving a plurality of encoded information bits of an encoded information word received by the decoder,
wherein the decoder is configured to decode data according to binary Bose-Chaudhuri-Hocquenghem codes.

6. The decoder of claim 5, wherein the universal multipole block is further configured for receiving a plurality of encoded information bits and calculating a plurality of error coefficients based on the encoded information bits.

7. The decoder of claim 6, wherein the universal multipole block is further configured for outputting the plurality of error coefficients to the adder logic blocks.

8. The decoder of claim 6, wherein the adder logic blocks are configured for decoding an encoded information word having a plurality of parity bits based on the error coefficients received from the universal multipole block.

9. The decoder of claim 4, wherein the switching logic block is further configured for generating a first output based on a first set of encoded information bits included in the plurality of encoded information bits.

10. The decoder of claim 9, wherein the switching logic block is further configured for generating a second output based on a second set of encoded information bits included in the plurality of encoded information bits and for providing the second output to the plurality of adder logic blocks.

11. The decoder of claim 10, wherein the adder logic blocks are configured for decoding an encoded information word having a plurality of parity bits based on the error coefficients received from the universal multipole block and further based on the second output received from the switching logic block.

12. The decoder of claim 11, wherein the adder logic blocks are further configured for providing the decoded information word to the plurality of register blocks.

* * * * *